(12) United States Patent
Miller et al.

(10) Patent No.: US 6,337,453 B1
(45) Date of Patent: Jan. 8, 2002

(54) METHOD AND APPARATUS FOR ARC-FORMING A BONDING WIRE BALL WITH ATTENUATED ELECTRO-MAGNETIC INTERFERENCE

(75) Inventors: Charles F. Miller, Anaheim Hills; John C. Price, Rancho Mirage, both of CA (US)

(73) Assignee: West Bond, Inc., Anaheim, CA (US)

( * ) Notice: Subject to any disclaimer, the term of this patent is extended or adjusted under 35 U.S.C. 154(b) by 0 days.

(21) Appl. No.: 09/344,469

(22) Filed: Jun. 25, 1999

(51) Int. Cl.⁷ .............................................. B23K 31/00
(52) U.S. Cl. .................................................... 219/56.21
(58) Field of Search ............................ 219/56.21, 56.22; 228/110.1

(56) References Cited

U.S. PATENT DOCUMENTS 4,564,734 A  *  1/1986  Okikawa ................. 219/56.22
5,031,821 A  *  7/1991  Kaneda et al. ........... 228/110.1

* cited by examiner

Primary Examiner—Clifford C. Shaw
(74) Attorney, Agent, or Firm—William L. Chapin

(57) ABSTRACT

An improved apparatus and method for forming a fusion ball at the end of a wire protruding from an ultrasonic bonding tool preparatory to making a ball bond to a workpiece includes shielding means for attenuating electromagnetic interference (EMI) emissions from an electrical arc discharge used to form the ball, which EMI emissions may damage sensitive electronic circuitry on a workpiece. In a preferred embodiment, a ball-forming arc discharge to a wire end occurs with a spark chamber in an electrically conductive electrostatic shield and preferably includes a ferromagnetic shield cup surrounding the chamber. According to the method of the present invention, a capillary ultrasonic bonding tool having a severed end of a gold bonding wire protruding from a capillary bore through the tool is moved away from a vertical line of action between the tool and a workpiece. The tool is then moved downwardly to insert the wire end into an opening provided in a shielded spark chamber located above the plane of the workpiece, where an electrical spark arcing from a high voltage electrode to the severed wire end within the chamber delivers a controlled amount of energy to the wire end to form threat a fusion ball. The tool tip is then moved upwardly to withdraw the wire end from the spark chamber, and moved back to the line of action of the tool tip, preparatory to moving the tool tip downwards along the line of action to bond the ball-end of the wire to a bond site on the workpiece.

35 Claims, 9 Drawing Sheets

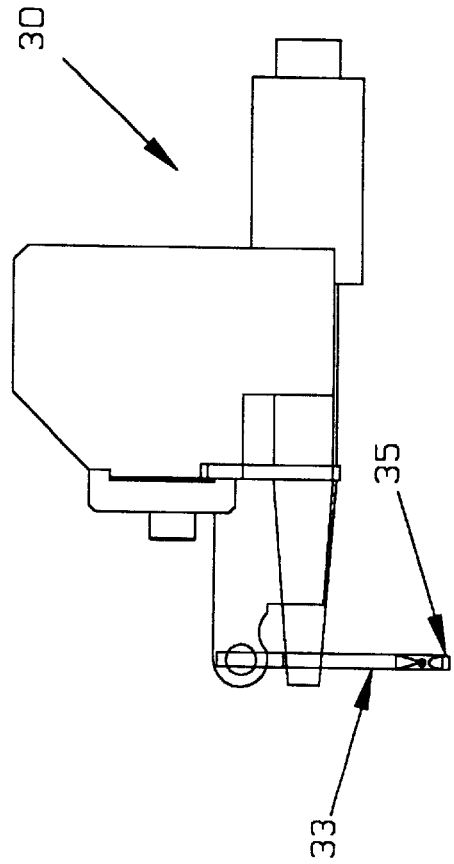
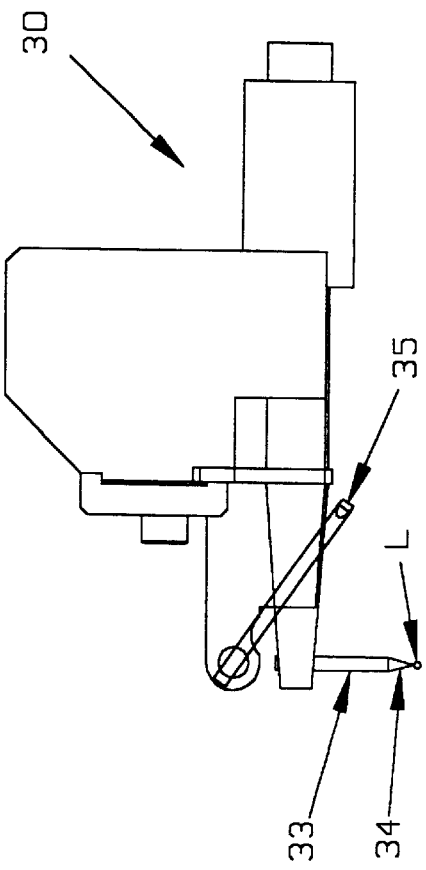
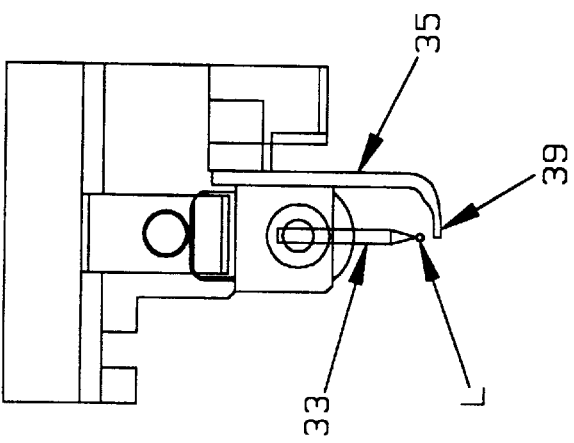

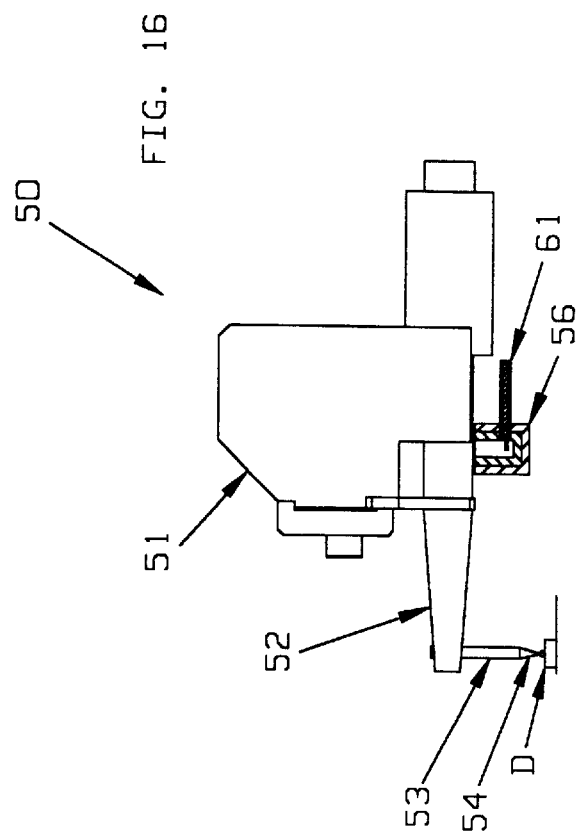
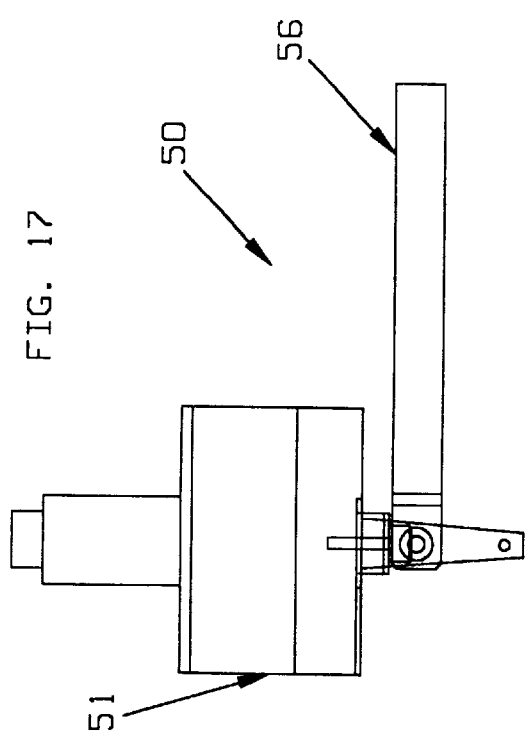
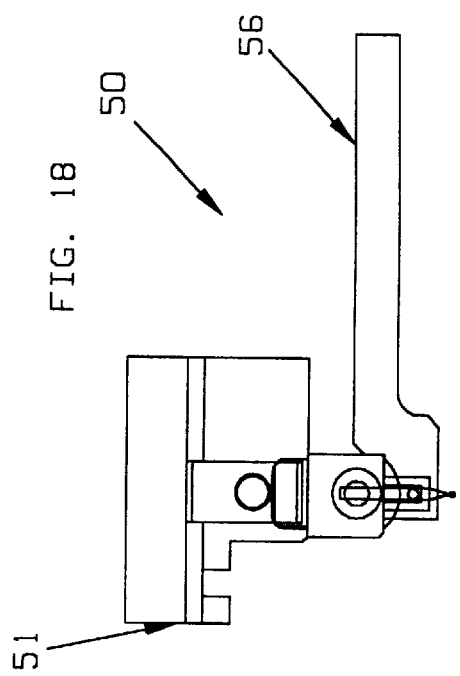

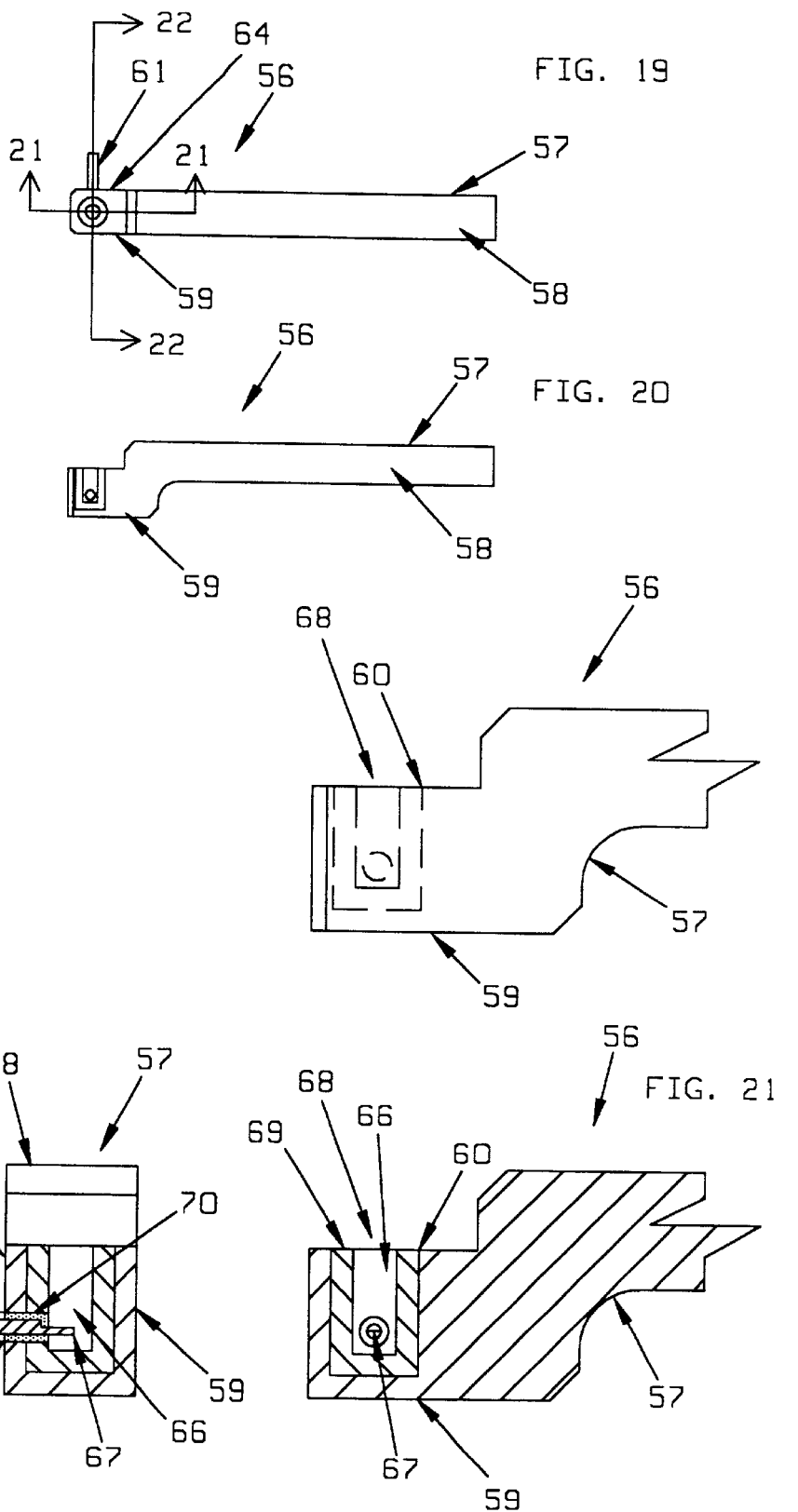

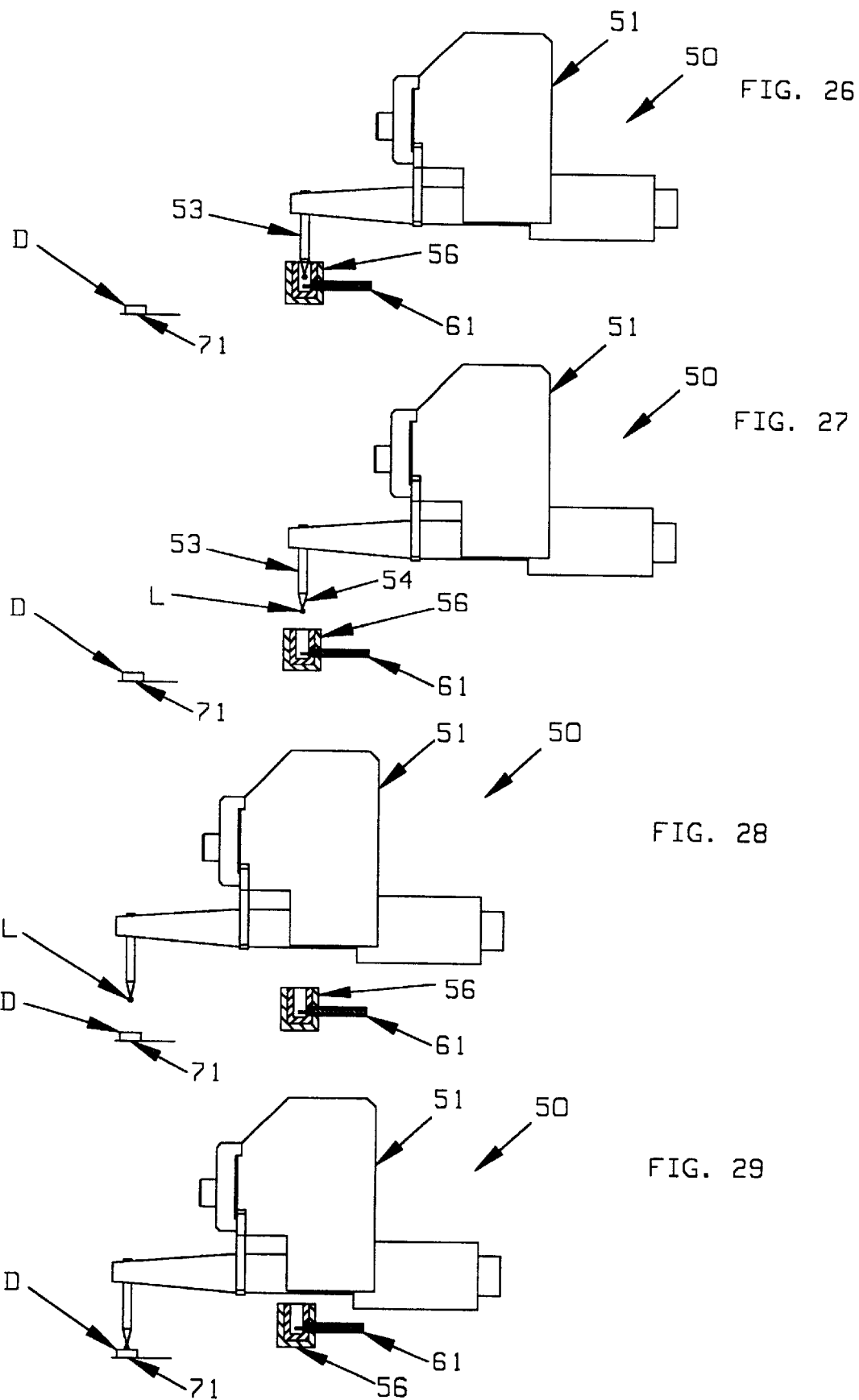

METHOD AND APPARATUS FOR ARC-FORMING A BONDING WIRE BALL WITH ATTENUATED ELECTRO-MAGNETIC INTERFERENCE

BACKGROUND OF THE INVENTION

A. Field of the Invention

The present invention relates to ultrasonic wire bonding machines of the type used to weld interconnecting wires to miniature electronic devices such as integrated circuits and magnetic read/write heads used in disk drive memories. More particularly, the invention relates to a method and apparatus for arc-forming a fusion ball at the end of a bonding wire in a shielded enclosure which substantially attenuates electromagnetic interference signals emitted from the arc discharge that might damage sensitive circuitry of a workpiece near the discharge.

B. Description of Background Art

Integrated circuits are fabricated from thin slices of a semi-conducting material such as silicon, germanium, or gallium arsenide. The slices are cut into small squares or rectangles referred to as chips or dice, ranging in size from squares about 100 mil. (0.100 inch) on a side to several hundred mils on a side. Transistors, diodes, resisters and interconnecting circuit paths are formed on the chip or die by diffusing impurities into selected regions of the chip, and by depositing various conducting paths and insulating layers onto the chip.

After a semi-conductor chip or die has been fabricated as described above, it must be attached to a base or carrier forming part of a package or container to protect the delicate die from damage. Prior to packaging, conductive pads providing input and output ports to the die must be electrically interconnected to more robust leads or terminals which extend outward through a container or package used to enclose the die. These interconnections are customarily made using fine aluminum or gold wires which are ultrasonically, thermosonically or thermo-compression welded to the pads and leads by a bonding tool that applies ultrasonic energy, a combination of heat and ultrasonic energy, or heat and pressure, respectively, to a bonding site. Since the connection pads of a microcircuit are extremely tiny and closely spaced, great precision is required in positioning the tip of a bonding tool relative to the microcircuit.

A preferred method of ultrasonically or thermosonically bonding interconnecting wires to the die pads and external leads of an integrated circuit is referred to as ball and stitch bonding. The method employs a fine gold or aluminum wire which is fed towards a work piece through a longitudinally disposed coaxial bore of a generally cylindrically-shaped bonding tool. The bonding tool has a frusto-conically-shaped lower or outer end portion having a lower face provided with a chamfered wire exit opening which communicates with the bore through the tool. The upper end of the tool is vibrated by an ultrasonic transducer, so that when the end of a wire is pressed against a metallic bonding site such as a conductive pad on a semiconductor die, or a lead, and vibrated by the transducer, an intermetallic bond or weld is made between the wire end and the bonding site.

Typical ultrasonic bonding tools used in the semiconductor industry have bore lengths of an inch or so, and diameters of 0.0015 inch to 0.002 inch (38 $\mu$m to 50 $\mu$m) and use gold bonding wires having a diameter of 0.001 inch to 0.00125 inch (25 $\mu$m to 30 $\mu$m). Such bores as well as the tools themselves are usually referred to in the industry as capillaries.

In the usual method of bonding interconnecting wires to an integrated circuit using a capillary bonding tool, the end of a bonding wire protruding from the chamfered exit opening of the tool is first melted or fused and allowed to cool, forming a solidified ball having a diameter ranging from about 1.5 to 3 times the diameter of the wire. This process is called "flaming off" and is accomplished by use of a fine diameter hydrogen flame, or by an electrical arc discharge. The latter technique is referred to as "Electronic Flame Off," or "EFO."

After a ball has been formed at the end of a bonding wire by either of the two flame-off methods described above, the capillary tool is lowered towards a workpiece and the ball is pressed against a conductive pad on the upper surface of a semiconductor die or other such miniature electronic component. Ultrasonic energy is then applied to the upper end of the tool, causing the lower end of the tool to vibrate frictionally in contact with the pad. Frictional heating produced by the vibration causes the lower surface of the ball to partially remelt and weld to the conductive pad, thus forming a ball bond. In thermosonic bonding, externally applied heat is used in conjunction with ultrasonic energy to aid in melting the interfacial surfaces between the ball and pad, thus facilitating formation of a ball bond.

Upon completion of a ball bond between a wire and a pad, the bonding tool is moved laterally and upwardly away from the ball bond to a location overlying a desired bonding site on a package lead, with the bonding wire paying out in an arcuately curved length from the ball bond. The bonding tool is again lowered to press the lower side of the wire against the lead, and ultrasonic energy applied to the tool to make a "stitch" bond. The bonding tool is then raised, along with clamping jaws located above the tool which grip the wire, severing the wire at its thinnest cross section, near the outer lateral end of the stitch bond. To complete the ball and stitch bonding cycle, a ball is formed on the severed end of the bonding wire protruding from the bore of the bonding tool, preparing the wire to make another ball bond.

A typical microcircuit has dozens or even hundreds of leads; therefore, it can be appreciated that ball formation in the circuits of the microcircuit must be repeated many times during the wire bonding process. For that reason, most capillary ultrasonic wire bonding machines incorporate computer controlled motor drive mechanisms which repetitively and cyclically position the bonding tool tip and wire end near a hydrogen torch flame or electrical flame-off electrode to form a ball. Automated ball-forming mechanisms are utilized in bonding machines which employ manually operated micropositioners to position the tool tip relative to a workpiece, such as those described in U.S. Pat. Nos. 3,474,685 and 5,871,136 issued to the present inventor, as well as in automatic bonding machines such as the West Bond Model 2400B, described in U.S. Pat. No. 4,125,798.

Since the amount of energy delivered by an electrical arc discharge is more readily and precisely controllable than that delivered by a hydrogen flame, the size of the fusion ball may be more closely controlled by using the EFO. Accordingly, the EFO method has been increasingly used by the semiconductor industry. However, formation of bonding wire balls by an arc discharge has heretofore been problematic, because it is believed that electromagnetic interference (EMI) energy emitted during the discharge can damage sensitive electronic components. This effect is particularly noticeable in such components as read/write heads for magnetic disk memories, which are so constructed as to produce induced voltages from relatively small changes in magnetic flux. Thus, the relatively large transient electromagnetic fields produced by an arc discharge near such workpieces can induce destructively large voltages and/or currents in the workpiece. The present invention was conceived of to address the aforementioned problem, by providing a method and apparatus for arc-forming a fusion ball at the end of a bonding wire, while attenuating potentially damaging EMI emissions from the arc discharge.

OBJECTS OF THE INVENTION

An object of the present invention is to provide a method for forming a fusion ball at the end of a bonding wire of an ultrasonic bonding machine by means of an electrical arc discharge, while minimizing electromagnetic interference (EMI) emitted from the discharge towards a workpiece.

Another object of the invention is to provide an apparatus for arc-forming a fusion ball at the end of a bonding wire which incorporates means for attenuating EMI produced by the arc discharge.

Another object of the invention is to provide a method and apparatus for forming a fusion ball at the end of a bonding wire by an arc discharge which attenuates emissions of EMI from the discharge that are incident upon a workpiece.

Another object of the invention is to provide a method for arc-forming a fusion ball at the end of a bonding wire in which the wire end is inserted into a spark chamber which is electromagnetically shielded to attenuate EMI emissions from a ball-forming arc within the chamber.

Another object of the invention is to provide a method for forming a fusion ball at the end of a bonding wire in which an ultrasonic bonding tool containing the bonding wire is displaced laterally away from the line of action of the tool and moved towards an electromagnetically shielded spark chamber to thereby insert a wire end into the chamber and form a fusion ball thereon by an arc discharge within the chamber.

Another object of the invention is to provide an electromagnetically shielded spark chamber for forming a fusion ball at the end of a bonding wire while attenuating EMI emissions from a ball-forming arc discharge to the wire end.

Another object of the invention is to provide a shielded spark chamber for arc-forming a fusion ball at the end of a bonding wire which includes an electrostatic shield comprised of a conductive shell forming a closed circuit.

Another object of the invention is to provide a shielded spark chamber for arc-forming a fusion ball at the end of a bonding wire which includes a magnetic shield comprised of a ferromagnetic shell.

Another object of the invention is to provide an apparatus for arc-forming a fusion ball at the end of a bonding wire which includes a spark chamber containing an electromagnetically shielded cup having protruding into the interior space thereof an insulated high voltage conductor terminating in an exposed conductive end, means for translating an ultrasonic bonding tool and wire end protruding therefrom to a location proximate the cup, means for moving the wire end into the cup proximate the high voltage conductor end, and means for supplying a high voltage pulse to the conductor end of sufficient voltage to form an arc to the wire end and of sufficient energy to melt the wire end and form thereon a fusion ball.

Various other objects and advantages of the present invention, and its most novel features, will become apparent to those skilled in the art by perusing the accompanying specification, drawings and claims.

It is to be understood that although the invention disclosed herein is fully capable of achieving the objects and providing the advantages described, the characteristics of the invention described herein are merely illustrative of the preferred embodiments. Accordingly, we do not intend that the scope of our exclusive rights and privileges in the invention be limited to details of the embodiments described. We do intend that equivalents, adaptations and modifications of the invention reasonably inferable from the description contained herein be included within the scope of the invention as defined by the appended claims.

SUMMARY OF THE INVENTION

Briefly stated, the present invention comprehends an improved apparatus and method for forming a fusion ball at the end of a wire to be used for making ultrasonic ball bonds on a workpiece, in which electromagnetic interference (EMI) emissions potentially damaging to sensitive electronic circuitry of the workpiece are substantially attenuated.

According to the present invention, an ultrasonic bonding tool is moved so as to position the end of a fine gold wire protruding from the capillary bore of the bonding tool within an open upper end of a spark chamber which is shrouded on the sides and bottom thereof by electrically conductive and/or ferromagnetic shields. The shields are effective in attenuating electromagnetic interference (EMI) radiating from an arc discharge used to form a fusion ball on the wire end within the spark chamber, thus reducing the amplitude of transient electromagnetic waves incident upon a workpiece on a work plane located beneath the ball-forming arc. A preferred embodiment of a spark chamber in the apparatus according to the present invention comprises a copper block having in an upper face thereof a blind cylindrical bore which receives a cylindrical cup made of a ferromagnetic material such as PERMALLOY that has a high relative magnetic permeability. The spark chamber includes an insulated high voltage conductor which protrudes through aligned apertures through the block and cup, the high voltage conductor terminating in an electrode having an exposed conductive tip centered within the cup.

According to the method of the present invention, a capillary ultrasonic bonding tool, which has a length of bonding wire protruding outwardly from a capillary bore through the tool, is moved laterally rearward from a vertical line of action between the tool and a workpiece. The tool tip is then moved downwardly to insert the wire end into an opening provided in a shielded spark chamber located above the plane of the workpiece, where an electrical spark arcing from a high voltage electrode to the severed wire end within the chamber delivers a controlled amount of energy to the wire end sufficient to melt the wire end and form thereat a fusion ball of a predetermined diameter, when the melted wire end cools and solidifies. The tool tip is then moved upwardly, withdrawing the wire end from the spark chamber, and moved laterally forward to the line of action of the tool tip, preparatory to moving the tool tip downwards along the line of action to bond the ball end of the wire to a bond site on the workpiece.

BRIEF DESCRIPTION OF THE DRAWINGS

FIG. 13 is a front elevation view similar to that of FIG. 11, but showing a fusion ball at the end of a bonding wire, that was formed by electrical arc discharge from the tip of the electrode to the end of the wire.

FIG. 14 is a right side elevation view of the apparatus of FIG. 13.

FIG. 15 is a right side elevation view similar to that of FIG. 14, but showing the electrode of the apparatus pivoted rearward to permit the tool tip and ball end of the wire to be moved into contact with an intended bond site on a work piece, and the ball bonded thereto.

FIG. 16 is a side elevation of an apparatus according to the present invention for arc-forming a fusion ball at the end of a bonding wire, the apparatus incorporating means for attenuating EMI emissions from the arc discharge.

FIG. 17 is an upper plan view of the apparatus of FIG. 16.

FIG. 18 is a front elevation view of the apparatus of FIG. 16.

FIG. 19 is an upper plan view of a shielded spark chamber comprising part of the apparatus of FIG. 16.

FIG. 20 is a front elevation view of the spark chamber of FIG. 19.

FIG. 21 is a fragmentary medial longitudinal sectional view of the spark chamber of FIG. 19, taken along line 21—21.

FIG. 22 is a transverse sectional view of the spark chamber of FIG. 19, taken along line 22—22.

FIG. 26 is a view similar to that of FIG. 25, but showing an arc discharge from an electrode within the spark chamber to the end of the wire having formed a fusion ball thereon.

FIG. 27 is a view similar to that of FIG. 26, but showing the bonding tool tip and wire moved vertically upward out of the spark chamber.

FIG. 28 is a view similar to that of FIG. 27, but showing the bonding tool tip and wire moved forward relative to the spark chamber.

FIG. 29 is a view similar to that of FIG. 28, but showing the tool tip of the apparatus moved downwardly into contact with a workpiece, to thereby bond the ball at the end of the wire to an intended bonding site.

DESCRIPTION OF THE PREFERRED EMBODIMENTS

The novel features and advantages of the present invention may be best understood by first considering briefly the process of bonding interconnecting wires between semiconductor die pads and leads of an integrated circuit by the ball and stitch bonding method, as depicted in FIGS. 1 through 7, followed by a description of prior art methods for forming a ball at the end of a bonding wire, as depicted in FIGS. 8–15, and a detailed description of a preferred embodiment of the present invention, as depicted in FIGS. 16 through 29.

Figure 1A:
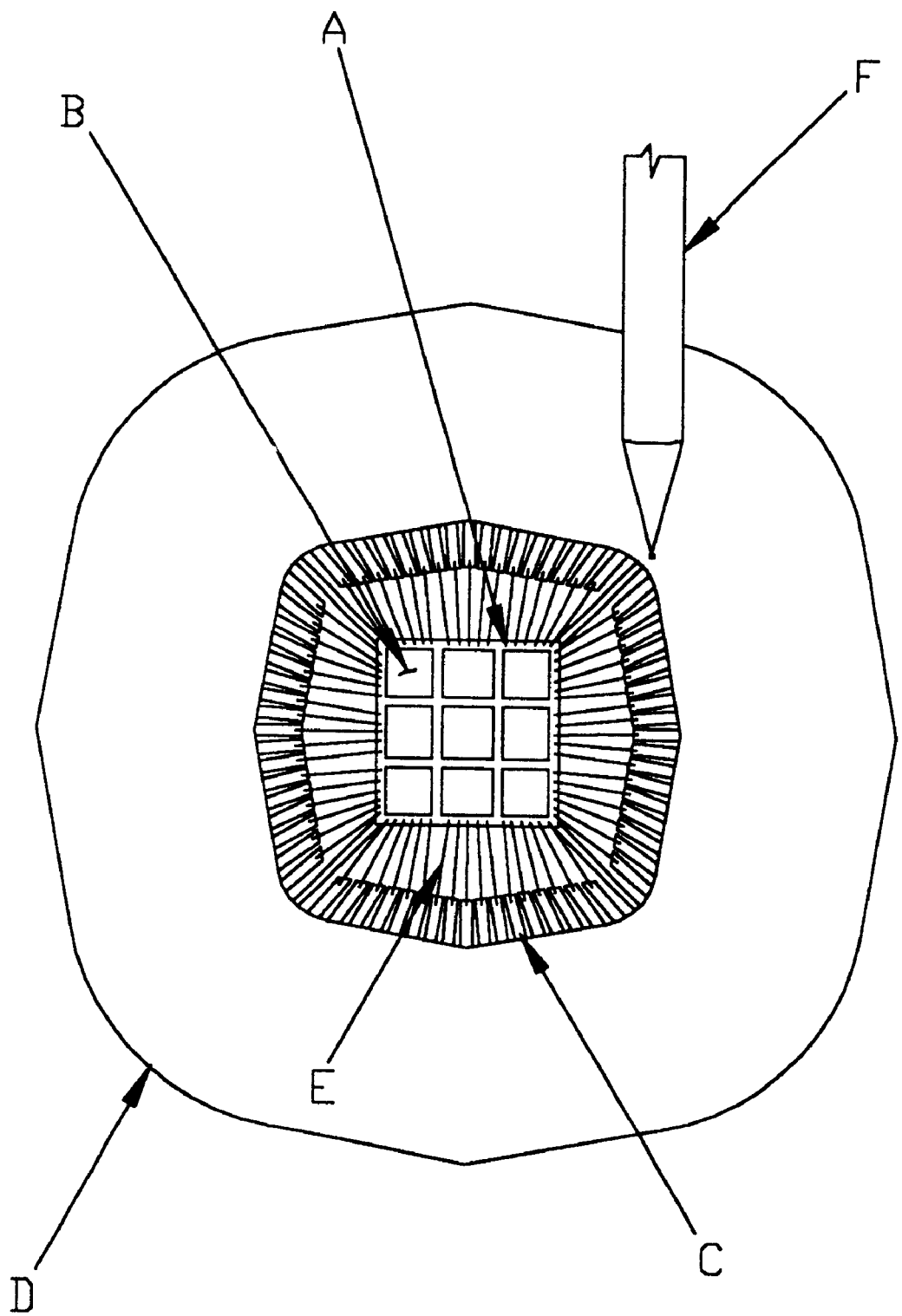
FIG. 1A is a perspective view of a microcircuit having interconnecting wires each bonded at one end thereof to a conductive pad on a semi-conductor die, and at the other end thereof to an external lead, and showing an ultrasonic bonding tool used to make the bonds.
Figure 1B:
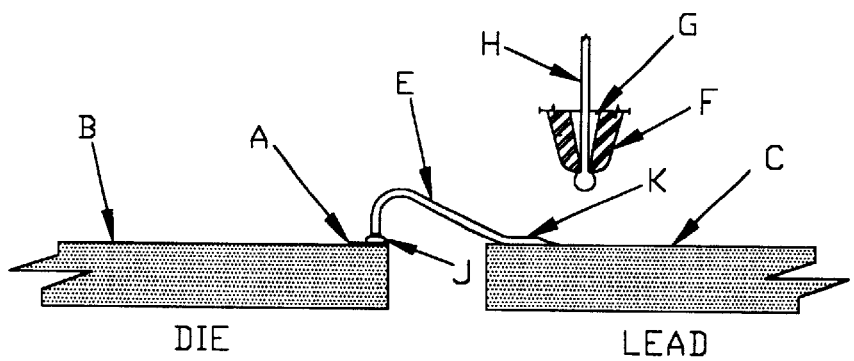
FIG. 1B is a sectional view of the articles of FIG. 1A.
Figure 2:
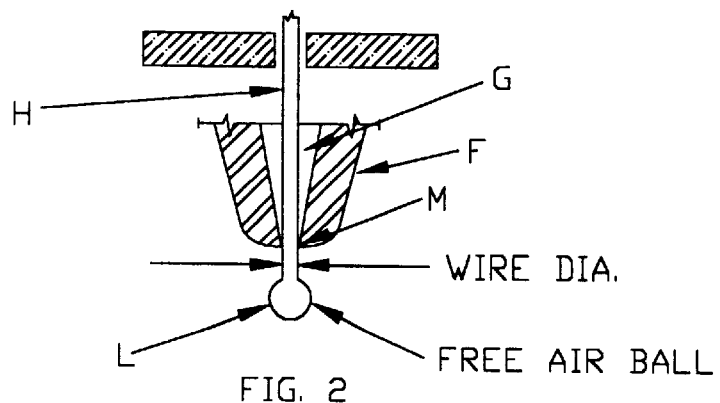
FIG. 2 is a fragmentary view of a tool of FIG. 1B, on an enlarged scale.

Referring first to FIGS. 1A and 1B, a conventional method of bonding interconnecting wires between conductive pads A of a semiconductor die B to leads C of an integrated circuit D may be seen to utilize lengths of fine gold or aluminum bonding wires E, opposite ends of which are ultrasonically or thermosonically welded to the pads and leads. As shown in FIG. 1B, the welds are effected by a capillary ultrasonic bonding tool F having a bore G through which a length of bonding wire H is paid out.

Figure 3:
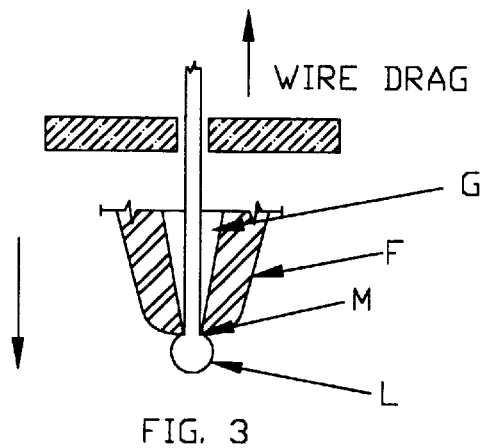
FIG. 3 is a view similar to that of FIG. 2, but showing a ball formed at the end of a bonding wire withdrawn into a chamfered entrance opening to the bore of the bonding tool.
Figure 4:
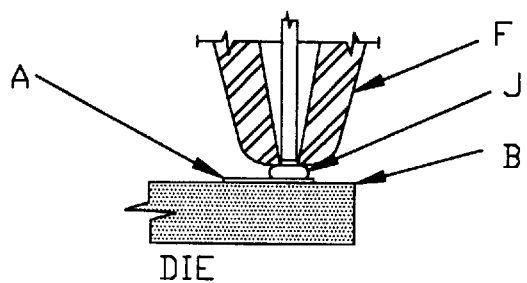
FIG. 4 is a view similar to that of FIG. 3, but showing the wire bonded to a die pad by the tool.

As shown in FIG. 1B, a customary way of welding a length of wire H to form a lead E includes as a first step forming a ball bond J on the upper surface of a conductive die pad A, followed by formation of second, stitch bond K on the support surface of a package lead C. As shown in FIGS. 2–7, the ball and stitch bonding cycle includes the steps of first melting the end of wire H protruding outwards through bore 6 of an ultrasonic bonding tool F with a hydrogen flame or electrical arc discharge, and allowing the melted wire end to cool and solidify into a "free air" ball L, which typically has a diameter of 1.5 to 3.0 times the diameter of the wire. In step 2 of the bonding cycle, as shown in FIG. 3, tool F is moved downwardly towards a bonding site such as pad A on a semiconductor die B comprising a workpiece, and wire H moved inward into bore G of the tool to seat ball L in a chamfered lower exit opening M of the bore. Step 3 of the bonding cycle consists of moving tool F further downwards to press ball L into contact with a die pad A, and applying ultrasonic energy to the upper end of the tool, thereby vibrating the lower end of tool F and moving the ball frictionally in contact with the die pad, thus welding the contacting surfaces of the ball and pad together to form a first, ball bond J.

Figure 5:
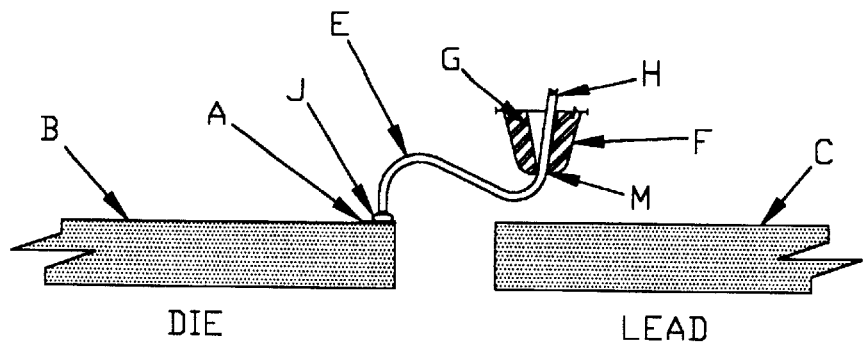
FIG. 5 is a view similar to that of FIG. 4, but showing the free portion of wire and bonding tool moved vertically upwardly and laterally outwardly preparatory to bonding the wire to a lead.
Figure 6:
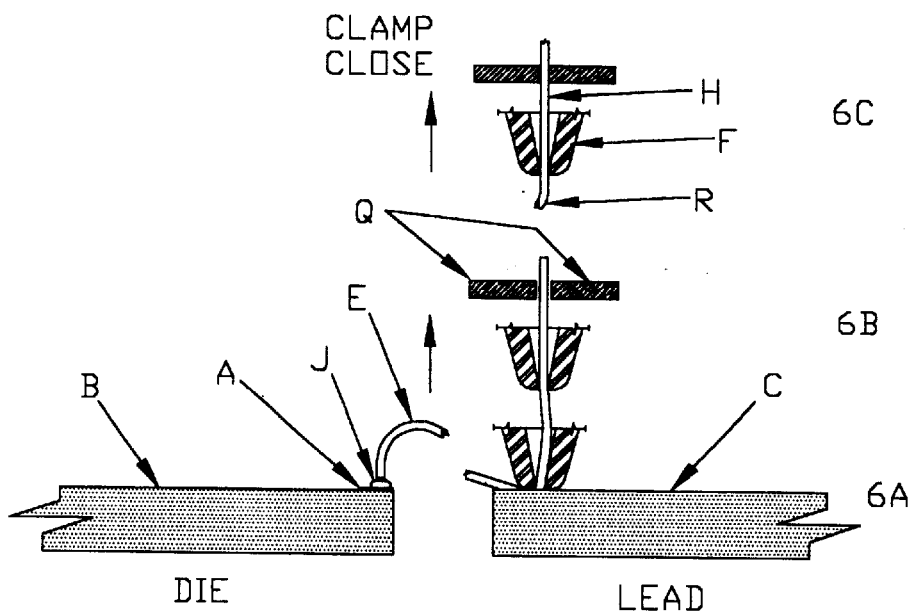
FIG. 6 is a view similar to that of FIG. 5, but showing a stitch bond formed between the lead and wire, and the wire pulled upward to sever it.

In step 4 of the ball and stitch bonding cycle, shown in FIG. 5, tool F is moved upwardly and laterally away from ball bond J to a position overlying a second, "stitch" bond site on a lead package C, paying out wire E from the ball bond as the tool is moved.

Step 5 of the bonding cycle, shown in FIG. 6A, consists of moving bonding tool F downward to press the lower surface of the wire E paid out from ball bond J against the upper surface of lead E, and once again applying ultrasonic energy to the tool to thereby form a second "stitch" bond K on package lead C.

Figure 7:
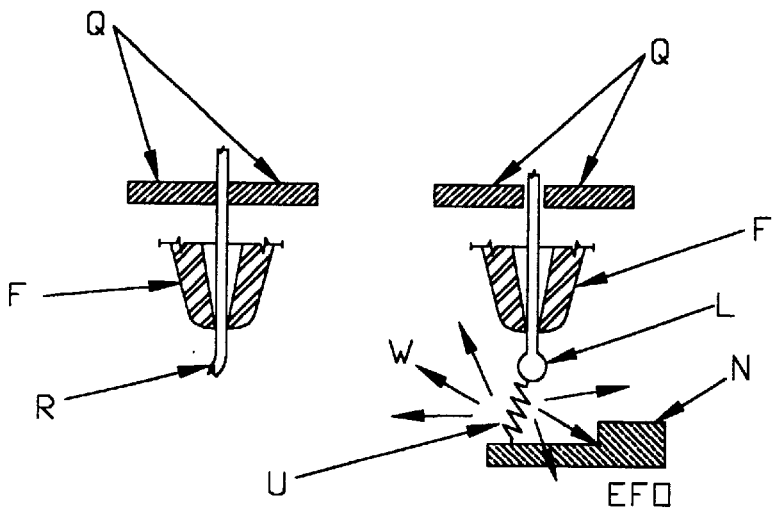
FIG. 7 is a view similar to that of FIG. 6, showing a fusion ball being formed on the severed wire end.

In step 6 of the bonding cycle, tool F is moved upwardly from stitch bond K, as shown in FIG. 6B, and wire H squeezed between wire clamp jaws Q, which are moved upwardly to pull and thereby sever the wire at its thinnest cross section near the outer end of the stitch bond K, leaving a free end or tail R of the wire protruding from tool F. A ball L is then formed in severed end or tail R of wire H, either by positioning the end in a hydrogen flame, or, as shown in FIG. 7, by positioning the end sufficiently close to a high voltage electrode N of an "electronic flame-off" (EFO) torch to allow a spark U to traverse the gap between the wire end and electrode and thereby initiating an electrical arc discharge between the electrode and wire end of sufficient energy to melt the wire end and form thereat a ball L. An undesirable side effect of using the EFO method is the production of electromagnetic interference (EMI) energy waves W emanating from the arc discharge which may impinge upon and damage sensitive electronic circuitry of a workpiece located near the arc discharge.

FIGS. 8–15 illustrate a prior art ultrasonic bonding machine which employs an electronic flame-off torch (EFO) to make a fusion ball at the end of bonding wire, preparatory to making a ball bond on a workpiece.

Figure 8:
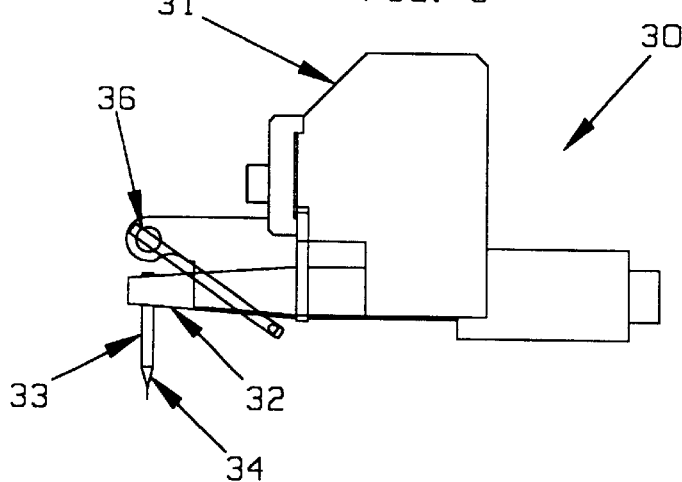
FIG. 8 is a fragmentary right side elevation view showing a prior art ultrasonic wire bonding machine and components thereof used to form a ball at the end of a wire.
Figure 11:
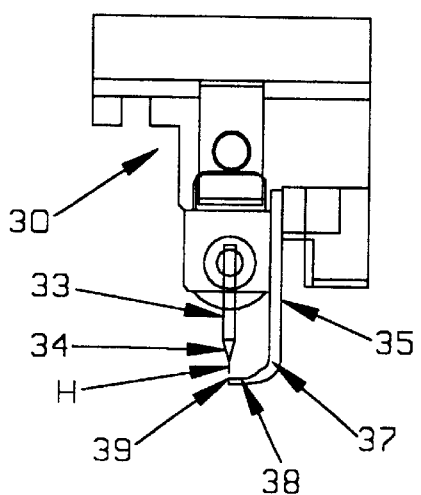
FIG. 11 is a front elevation view of the apparatus of FIG. 10, showing an electrode thereof pivoted forward into position below the end of a bonding wire protruding through the tip of a bonding tool.
Figure 12:
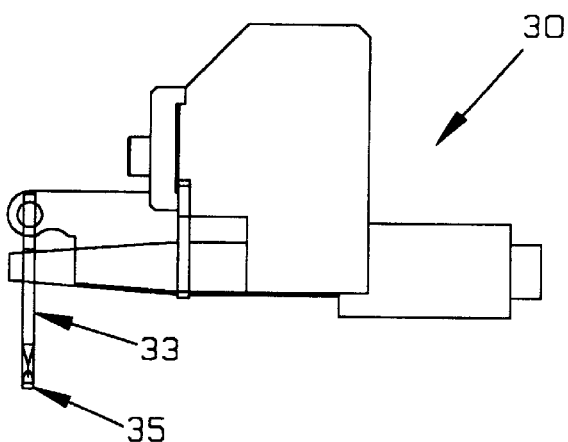
FIG. 12 is a right side elevation view of the apparatus of FIG. 11.

Referring first to FIG. 8, a prior art bonding machine 30 may be seen to include a support structure 31 on which is mounted an ultrasonic transducer 32 which protrudes forward from the support structure, and a capillary ultrasonic bonding tool 33 which protrudes perpendicularly downwardly from the transducer.

Machine 30 includes means for moving transducer 32 and bonding tool 33 along a vertical (Z-axis) line of action directed generally along the longitudinal axis of the tool, and may also include means for moving the tip 34 of the bonding tool in X and/or Y directions orthogonal to the Z-axis.

As shown in FIGS. 8–11, bonding machine 30 includes an L-shaped stirrup bar 35 mounted on a laterally disposed pivot 36. Stirrup bar includes a vertically disposed straight upper leg portion 37 terminated at the lower end thereof by a laterally inwardly disposed foot 38. The inner end or tip 39 of foot 38 comprises a high voltage electrode energizable by a source of high voltage energy.

Figure 9:
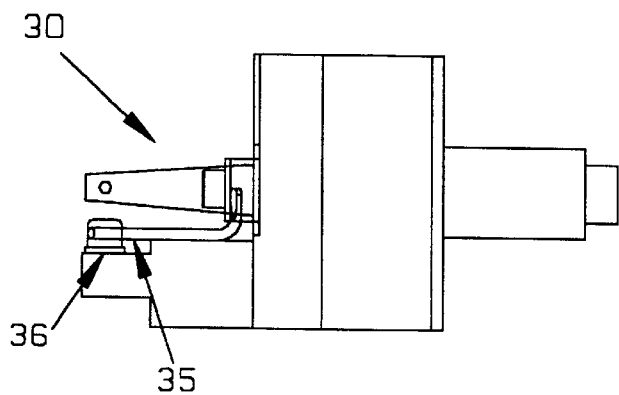
FIG. 9 is an upper plan view of the apparatus of FIG. 8.
Figure 10:
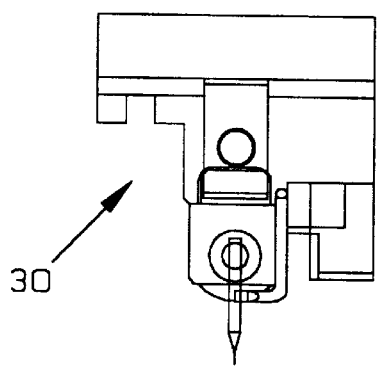
FIG. 10 is a front elevation view of the apparatus of FIG. 8.

As may be seen by referring to FIGS. 11–14 in conjunction with FIGS. 8–10, machine 30 includes a pneumatic actuator (not shown) for rotating stirrup 35 from an obliquely rearwardly disposed position, as shown in FIGS. 8–10, to a vertical position in which electrode tip 39 of the stirrup is positioned directly below the end of a wire H protruding from the bore of tool 34. In this position, high voltage is applied to electrode tip 39 of stirrup 35, causing a spark to jump to the end of wire H, which, along with tool 33, is maintained at ground potential. The spark causes an arc discharge to deliver a controlled amount of energy to the end of wire H to form thereat a free air ball L of a desired diameter, as shown in FIGS. 13 and 14. Then, as shown in FIG. 15, stirrup 35 is pivoted rearwardly to its inactive, stowed position, whereupon bonding tool 33 may be used to make a ball bond on a workpiece.

FIGS. 16–29 illustrate a method and apparatus according to the present invention for arc-forming a fusion ball at the end of a bonding wire, in which EMI emissions from a ball-forming arc are substantially attenuated.

Referring first to FIG. 16, ultrasonic bonding machine 50 may be seen to include a support structure 51 on which is mounted an ultrasonic transducer 52 which protrudes forward from the support structure, and a capillary ultrasonic bonding tool 53 which protrudes perpendicularly downwardly from the transducer. Tool 53 has a bore 55 which exits from lower end or tip 54 of the tool.

Machine 50 includes an actuator mechanism (not shown) for moving transducer 52 and bonding tool 53 along a vertical (Z-axis) line of action directed generally along the longitudinal axis of the tool, and may also include actuator mechanisms for moving the tip 54 of the bonding tool in an in/out, or Y-axis direction orthogonal to the Z-axis, and in a lateral, or X-axis direction.

As shown in FIGS. 16–18, ultrasonic bonding machine 50 according to the present invention includes a spark chamber 56 for arc-forming therewithin a fusion ball on the end of a bonding wire, the spark chamber incorporating shielding means for attenuating EMI emissions emitted by the arc.

Referring now to FIGS. 19–22, shielded spark chamber 56 may be seen to include a horizontally disposed, laterally elongated, rectangular cross section block 57 having a relatively long straight outer or rear shank portion 58 and a relatively shorter, straight inner end portion 59 parallel to and offset downwardly from the shank. As shown in FIGS. 19–22, inner end portion 59 of spark chamber 56 has formed therein a blind cylindrical bore 60 which protrudes downwardly from upper surface 61 of block 57.

As shown in FIGS. 21 and 22, spark chamber 56 is connected to a high-voltage cable 61 comprising an inner elongated central conductor 62 sheathed coaxially within an outer electrically insulating shell 63. Cable 61 protrudes through a perforation 65 in rear wall 64 of spark chamber 56 radially inwardly into a hollow cylindrical interior space 66 within cylindrical bore 60 of the spark chamber. Here conductor 62 of the cable is exposed to form a conductive electrode tip 67 centered radially within cylindrical interior space 66 of the spark chamber.

Block 57 of spark chamber 56 is made of an electrically conducting material, such as copper, which forms an electrostatic shield around electrode tip 67 of high-voltage cable 61. The electrostatic shield is effective in attenuating electromagnetic interference (EMI) energy which is produced when an arc discharge occurs between electrode tip 67 in interior space 66 of spark chamber 56 and the end of a bonding wire inserted into upper opening 68 of the spark chamber. A preferred embodiment of spark chamber 56 according to the present invention includes magnetic shielding means to further attenuate EMI emissions emanating from a ball-forming arc discharge within the chamber, beyond the attenuation achievable by utilizing an electrostatic shield alone. Thus, as shown in FIGS. 21 and 22, spark chamber 56 includes a cylindrically-shaped magnetic shield cup 69 which fits conformally within bore 60 in block 57. Magnetic shield cup 69 is made of a ferromagnetic material which has a high relative magnetic permeability, such as PERMALLOY or HYMU 80 manufactured by Carpenter Steel, Reading, Pa., As shown in FIGS. 21 and 22, magnetic shield cup 69 has a radially disposed perforation 70 through its cylindrical wall surface. Perforation 70 is radially aligned with perforation 65 through rear wall 64 of spark chamber block 57, and is of sufficient diameter to receive outer insulating sheath 63 of high-voltage cable 61.

In an example embodiment of spark chamber 56, block 57 of the spark chamber was made from copper and had an approximately square cross section of about 0.281 inch by 0.281 inch. Bore 60 in inner end portion 59 of block 57 had a diameter of about 0.188 inch and a depth of about 0.266 inch, and received a HYMU 80 magnetic shield cup 69 having an O.D. of 0.188 inch, a length of 0.266 inch and a wall thickness of 0.047 inch. Magnetic shield cup 69 was secured within bore 60 by a press fit.

FIGS. 23–29 illustrate a method of using the bonding machine 50 including shielded spark chamber 56 to form a fusion ball at the end of a bonding wire, while substantially attenuating EMI emission incident upon a workpiece.

Figure 23:
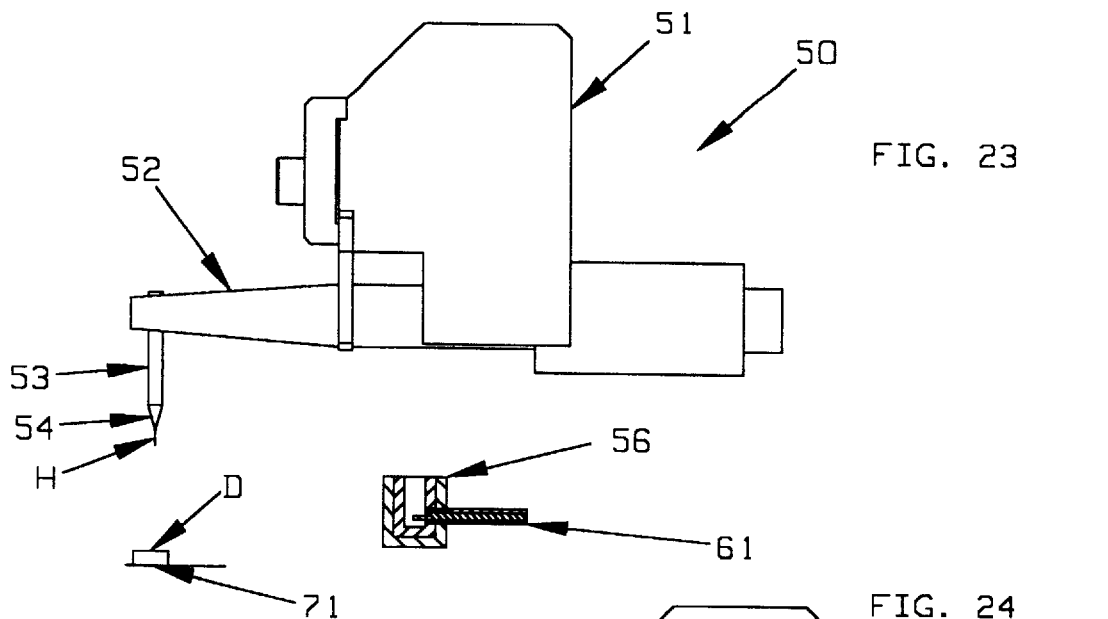
FIG. 23 is a partly sectional side elevation view of the apparatus of FIG. 16, prior to formation of a fusion ball at an end of a bonding wire protruding from a bonding tool tip.

Referring first to FIG. 23, a workpiece D such as an integrated circuit is shown located on a work surface 71 of ultrasonic bonding machine 50 according to the present invention. As shown in FIG. 23, tip 54 of ultrasonic bonding tool with a length of bonding wire H protruding downwardly from the tip through bore 55 of the tool is located above workpiece D. As is also shown in FIG. 23, spark chamber 56 of bonding machine 50 is located above and rearward of work surface 71 and workpiece D.

Figure 24:
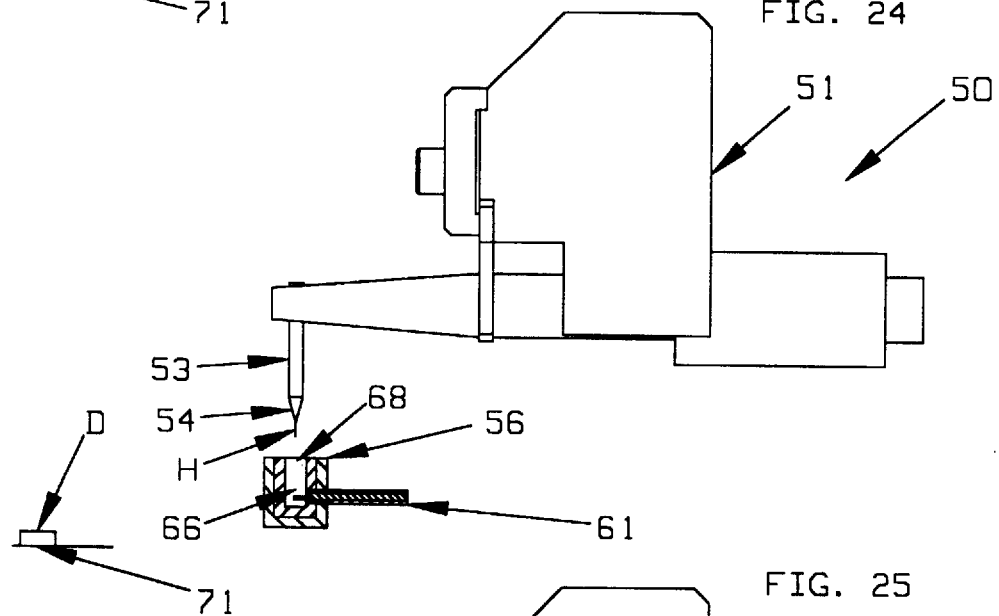
FIG. 24 is a view similar to that of FIG. 23, but showing the bonding tool tip moved rearward relative to the spark chamber of the apparatus.
Figure 25:
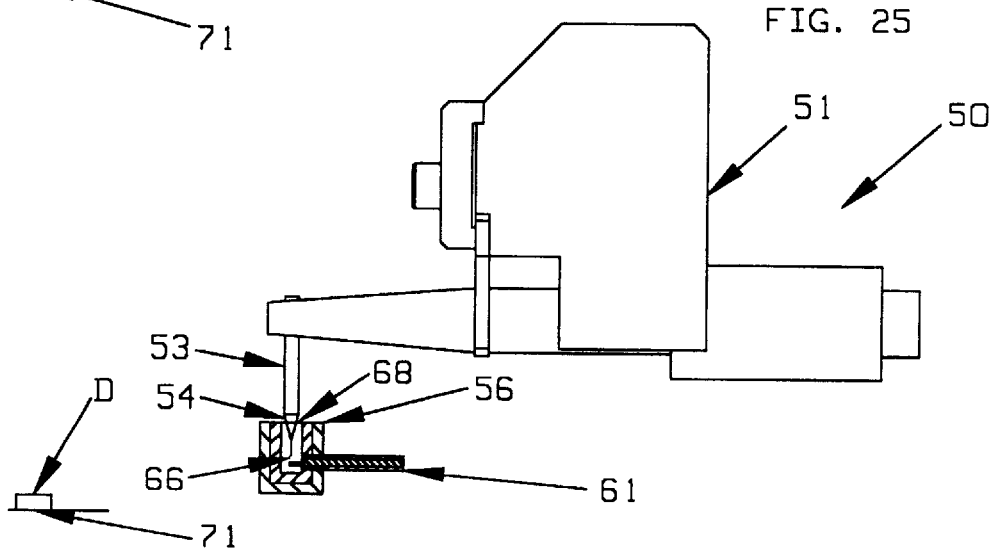
FIG. 25 is a view similar to that of FIG. 24, but showing the bonding tool tip of the apparatus and wire protruding therefrom moved vertically downward into the spark chamber of the apparatus.

Referring now to FIG. 24, support structure 51 for transducer 52 and bonding tool 53 is shown moved rearwardly from work surface 71 and workpiece D, to a position overlying upper opening 68 of spark chamber 56. Then, as shown in FIG. 25, tool tip 54 of tool 53 is moved downwardly into hollow interior space 66 of spark chamber 56, positioning the tip of wire H protruding from the tool sufficiently close to electrode tip 67 of high-voltage cable 61 for a spark to jump the gap between the wire end and electrode when the cable is energized with a high-voltage pulse. As shown in FIG. 26, an arc discharge is then initiated between the end of wire H and electrode 67, and an amount of electrical energy delivered to the wire end sufficient to melt the end of the wire and form thereat a fusion ball of a desired diameter. Next, as shown in FIG. 27, tool tip 54 is elevated out of spark chamber 56, with a solidified fusion ball forming a free air ball at the end of wire H.

As shown in FIG. 28, tool 53 is then advanced forward to a position overlying workpiece D on work surface 71, whereupon the tool tip may be moved downwardly to press ball L at the end of wire H into contact with the workpiece and form a ball bond, as shown in FIG. 29.

To test the effectiveness of attenuating EMI emissions in accordance to the method and apparatus of the present invention, a magnetic read/write head, manufactured by Hutchinson Technology, having the approximate dimensions of 1 mm square×¼ mm thick was positioned on work surface 71 in place of workpiece D. An oscilloscope having a band width of 100 MHz was then used to view transient current pulses induced in a 46 ohm resistor connected across the output terminals of the read head. With shielded spark chamber 56 removed and a fusion ball arc formed at the end of wire in free air, transient current spikes having a peak amplitude of about 0.65 milliamperes were measured. By comparison, with a ball forming arc discharge occurring in shielded spark chamber 56, the transient EMI induced current spikes in the sampling resistor were reduced to about 0.17 ma. These measurements indicate that spark chamber 56 provides an attenuation ratio of about 3.8, or 11.6 db. When a current probe was used to measure the EMI currents induced in the 46-ohm sensing resistor the corresponding measured values without and with the spark chamber, were about 6 ma and 1 ma, respectively. This attenuation ratio of 6 to 1 is equivalent to an attenuation of 15.5 db. The exact reason for the discrepancy in the attenuation measurements is not known. However, it is clear from either measurement that the apparatus and method according to the present invention provides substantial attenuation of EMI currents induced in a workpiece by an arc discharge used to form a fusion ball at the end of a bonding wire.

What is claimed is:

1. An apparatus for forming by means of an electric arc discharge a fusion ball on the end of a wire protruding from the bore of an ultrasonic bonding tool tip in preparation for using the wire to make a ball bond to a conductive pad of a workpiece, said apparatus including means for attenuating electromagnetic interference (EMI) emitted during said electric arc discharge and comprising:

a. a spark chamber comprising an enclosure including at least a first, lower electrically conductive, electrostatic shield plate effective in attenuating electromagnetic interference (EMI) waves produced by an electrical arc above said shield plate and incident upon a workpiece located in a plane below said spark chamber, said spark chamber having above a lower surface thereof a high voltage electrode connected by an electrical conductor to a source of high voltage energy, b. means for causing relative advancing movement between said wire end protruding from said bonding tool and said electrode to thereby position said wire end close to said electrode and above said shield for forming a fusion ball, and relative receding movement to permit unimpeded motion of said tool towards a workpiece, and c. means for energizing said conductor of high voltage energy to thereby cause an electrical spark to form an arc discharge between said electrode and said wire end of sufficient energy to melt said wire end and form a fusion ball therein.

2. The apparatus of claim 1 wherein said wire and said electrostatic shield plate are electrically conductively coupled to a common electrical ground.

3. The apparatus of claim 1 further including a first, lower ferromagnetic shield plate.

4. The apparatus of claim 1 wherein said first, lower electrostatic shield plate is further characterized as having peripheral side walls depending upwardly therefrom, thereby forming an upwardly concave electrostatic shield body having a hollow interior space and an open upper end.

5. The apparatus of claim 4 wherein said high voltage electrode is further defined as being located within said concave body.

6. The apparatus of claim 4 wherein said first, lower ferromagnetic shield plate is further characterized as having peripheral side walls depending upwardly therefrom, thereby forming an upwardly concave magnetic shield body having a hollow interior space and an open upper end coaxial with that of said electrostatic shield body.

7. The apparatus of claim 1 wherein said spark chamber is laterally offset from a line of action of said tool tip perpendicular to said workpiece.

8. The apparatus of claim 1 wherein said electrostatic shield plate is further characterized as being made of copper.

9. The apparatus of claim 1 wherein said electrostatic shield plate is electrically insulated from said high voltage electrode.

10. The apparatus of claim 1 wherein said electrostatic shield plate is not in a conductive circuit path for electrical current in said arc discharge.

11. An apparatus for forming by means of an electrical arc discharge a fusion ball on the end of a bonding wire protruding from the bore of an ultrasonic bonding toot tip to thereby prepare said bonding wire for making a ball bond to a conductive pad of a workpiece, said apparatus including means for attenuating electromagnetic interference (EMI) emitted during said electric arc discharge and comprising:

a. a spark chamber including a body having a hollow interior space and attenuating means for attenuating EMI emissions from an arc discharge within said space, and an open upper end, said body being laterally offset from a vertical line of action of said tool tip to said workpiece, b. a high voltage electrode positionable within said body, c. means for conducting a source of high voltage current to said electrode, d. means for causing lateral relative motion between said tool tip and said body to thereby locate said wire end protruding from said tool tip above said electrode and said opening, for moving said tool tip vertically downwardly towards said opening sufficiently far for said wire end to be within said body and within sparking gap distance of said electrode, and for reversing said lateral and vertical morons upon completion of an arc discharge between said electrode and said wire end, and e. means for energizing said high voltage energy source to cause an electrical spark to form an arc discharge between said electrode and said wire end with sufficient energy to form a fusion ball thereon.

12. The apparatus of claim 11 wherein said attenuating means is further characterized as including a ferromagnetic material at least partially enclosing said hollow interior space.

13. The apparatus of claim 11 wherein said attenuating means is further defined as including a electrically conductive material comprising an electrostatic shield at least partially inclosing said hollow interior space.

14. The apparatus of claim 13 wherein said wire and said electrostatic shield are electrically conductively coupled to a common electrical ground.

15. The apparatus of claim 11 wherein said attenuating means is further characterized as including a ferromagnetic material at least partially enclosing said hollow interior space.

16. A spark chamber for use with a wire bonding machine of the type used to bond a wire having a solidified fusion ball at the end of said wire to a workpiece, said fusion ball being formed by an electrical arc discharge between an electrode and said wire end, said spark chamber comprising an electrically conductive body effective in attenuating electromagnetic interference (EMI) waves and having therein a cavity in which is located an electrode which is electrically isolated from said body, said electrode being connectable to a source of high voltage energy by means of an insulated conductor which protrudes through a side wall of said cavity and through said body to the exterior thereof, said cavity having an opening into which said wire end may be inserted and positioned sufficiently close to said electrode for said high voltage source to initiate a spark therebetween.

17. The spark chamber of claim 16 further including a ferromagnetic cup at least partially enclosed in said cavity.

18. In a wire bonding machine of the type used to bond a wire having a solidified fusion ball at the end of said wire to a workpiece, said fusion ball being formed by an electrical arc discharge between an electrode and said wire end, the improvement comprising means for positioning temporarily during said arc discharge a shield between said arc discharge and said workpiece, said shield being effective in attenuating EMI emissions produced by said arc discharge and incident upon said workpiece.

19. The improvement of claim 18 wherein said shield is further characterized as including ferromagnetic material.

20. The improvement of claim 18 wherein said shield is further characterized as including electrically conductive material effective in forming an electrostatic shield.

21. The improvement of claim 20 wherein said wire and said electrostatic shield are electrically conductively coupled to a common electrical ground.

22. The improvement of claim 20 wherein said shield is further characterized as including ferromagnetic material.

23. The improvement of claim 18 further including an electrical resistive element in series with said electrical arc discharge electrode to thereby limit current therein to a predetermined peak value.

24. A method for attenuating EMI energy incident upon a workpiece, said EMI energy being produced by an electrical arc discharge used to form a ball at the end of a wire protruding from the bore of an ultrasonic bonding tool tip preparatory to making a ball bond between said wire and said workpiece, said method comprising the steps of:

a. positioning a shield effective in attenuating said EMI energy between said tool tip and said workpiece during formation of said ball, and b. withdrawing said shield upon completion of said ball formation.

25. The method of claim 24 wherein said shield is further defined as including a ferromagnetic shielding material.

26. The method of claim 24 wherein said shield is further characterized as including an electrostatic shielding material.

27. The apparatus of claim 26 wherein said wire and said electrostatic shielding material are electrically conductively coupled to a common electrical ground.

28. The method of claim 26 wherein said shielding material is further defined as including a ferromagnetic shielding material.

29. A method for attenuating EMI energy incident upon a workpiece, said EMI energy being produced by an electrical arc discharge used to form a ball at the end of a wire protruding from the bore of an ultrasonic bonding tool tip preparatory to making a ball bond between said wire and said workpiece, said method comprising the steps of:

a. moving said tool tip in a first direction away from an intended line action to said workpiece, b. moving said tool tip towards a shielded enclosure effective in attenuating said EMI energy in a second direction sufficiently far for said protruding wire end to be within said enclosure and proximate a high voltage electrode therewithin, c. initiating an arc discharge between said electrode and said wire end to thereby form a fusion ball thereat, d. moving said tool tip in said second direction away from said shielded enclosure to thereby remove said wire end from said enclosure, e. moving said tool tip in said first direction to said line of action to said workpiece.

30. The method of claim 29 wherein said shielded enclosure is further characterized as including electrostatic shielding material.

31. The method of claim 30 wherein said wire and said electrostatic shielding material are electrically conductively coupled to a common electrical ground.

32. The method of claim 30 wherein said shielded enclosure is further characterized as including ferromagnetic shielding material.

33. The method of claim 29 wherein said line of action of said tool tip is further defined as being perpendicular to said workpiece.

34. The method of claim 33 wherein said second direction is parallel to said line of action.

35. The method of claim 34 wherein said first direction joins said second direction and said line of action.

* * * * *